US010874033B2

(12) United States Patent
Bilski, Jr. et al.

(10) Patent No.: US 10,874,033 B2
(45) Date of Patent: *Dec. 22, 2020

(54) ELECTRONICS RACK WITH COMPLIANT HEAT PIPE

(71) Applicant: Aavid Thermal Corp., Wilmington, DE (US)

(72) Inventors: Walter John Bilski, Jr., Mohnton, PA (US); Sidrit Kosta, Philadelphia, PA (US)

(73) Assignee: Aavid Thermal Corp., Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/445,554

(22) Filed: Jun. 19, 2019

(65) Prior Publication Data

US 2020/0022286 A1   Jan. 16, 2020

Related U.S. Application Data

(63) Continuation of application No. 15/441,807, filed on Feb. 24, 2017, now Pat. No. 10,349,557.

(Continued)

(51) Int. Cl.
  *H05K 7/20* (2006.01)
(52) U.S. Cl.
  CPC ................. *H05K 7/20681* (2013.01)
(58) Field of Classification Search
  CPC ........... H05K 7/20336; H05K 7/20409; H05K 7/20509; H05K 7/20663; H05K 7/20418;

(Continued)

(56) References Cited

U.S. PATENT DOCUMENTS

| 4,546,407 A * | 10/1985 | Benenati | H05K 7/20545 |
| | | | 361/716 |
| 5,842,514 A * | 12/1998 | Zapach | H01L 23/427 |
| | | | 165/104.33 |

(Continued)

FOREIGN PATENT DOCUMENTS

CN           103058089           4/2013

OTHER PUBLICATIONS

Notice of Allowance from the U.S. Patent and Trademark Office for U.S. Appl. No. 15/441,792 dated Mar. 28, 2018 (12 pages).

(Continued)

*Primary Examiner* — Mukundbhai G Patel
(74) *Attorney, Agent, or Firm* — Michael Best & Friedrich LLP

(57) ABSTRACT

An electronics rack comprising a first cage, a first heat sink positioned at a rear and in thermal communication with the first cage, a second cage positioned above the first cage, and a second heat sink in thermal communication with the second cage. In another aspect, the present invention provides an electronics rack comprising a frame, a cage, a heat sink positioned at a rear of the frame, and a compliant thermal collector operatively positioned between the cage and the heat sink. The compliant thermal collector can comprise a heat pipe having a non-linear shape that facilitates flexing of the heat pipe to change the length of the thermal collector. The thermal collector advantageously includes a plurality of heat pipes and a contact bar coupling the plurality of heat pipes. Preferably, the rack further includes an adjusting mechanism (e.g., threaded rods) for adjusting a position of the contact bar.

28 Claims, 12 Drawing Sheets

Related U.S. Application Data

(60) Provisional application No. 62/299,336, filed on Feb. 24, 2016.

(58) Field of Classification Search
CPC . H05K 7/2069; H05K 7/20545; H05K 7/1489
USPC ........................................................ 361/725
See application file for complete search history.

(56) References Cited

U.S. PATENT DOCUMENTS

| | | | |
|---|---|---|---|
| 6,515,822 B1 | 2/2003 | White et al. | |
| 6,615,993 B1 | 9/2003 | Rudiger | |
| 7,012,807 B2 | 3/2006 | Chu et al. | |
| 7,133,283 B2 | 11/2006 | Faneuf et al. | |
| 7,180,734 B2 | 2/2007 | Jing | |
| 7,233,491 B2* | 6/2007 | Faneuf | H05K 7/20809 165/80.4 |
| 7,355,852 B2 | 4/2008 | Pfahnl | |
| 7,460,367 B2 | 12/2008 | Tracewell et al. | |
| 7,619,897 B2 | 11/2009 | Della Flora et al. | |
| 7,639,499 B1 | 12/2009 | Campbell et al. | |
| 7,839,640 B2 | 11/2010 | Hayashi et al. | |
| 7,876,525 B2 | 1/2011 | Wilkin et al. | |
| 7,907,409 B2* | 3/2011 | Wyatt | H05K 7/20809 165/104.26 |
| 7,946,639 B2 | 5/2011 | Bridges et al. | |
| 8,130,497 B2 | 3/2012 | Kondo et al. | |
| 8,170,724 B2 | 5/2012 | Kelley et al. | |
| 8,376,479 B2 | 2/2013 | Furey et al. | |
| 8,582,299 B1 | 11/2013 | Phillips et al. | |
| 8,594,857 B2 | 11/2013 | Lin et al. | |
| 8,599,559 B1 | 12/2013 | Morrison et al. | |
| 8,644,024 B2 | 2/2014 | Chen | |
| 8,654,532 B2 | 2/2014 | Chen et al. | |
| 8,743,562 B2 | 6/2014 | Hartman et al. | |
| 8,885,335 B2 | 11/2014 | Magarelli | |
| 8,934,245 B2* | 1/2015 | Yoshikawa | H01L 23/427 165/104.33 |
| 8,951,000 B2 | 2/2015 | McIntosh et al. | |
| 8,959,941 B2 | 2/2015 | Campbell et al. | |
| 9,380,728 B1* | 6/2016 | Dunwoody | H05K 7/20709 |
| 9,706,688 B2 | 7/2017 | Smith et al. | |
| 2002/0012236 A1 | 1/2002 | DiMarco | |
| 2006/0102575 A1 | 5/2006 | Mattlin et al. | |
| 2007/0120386 A1 | 5/2007 | Benysh et al. | |
| 2007/0201210 A1 | 8/2007 | Chow et al. | |
| 2008/0056867 A1 | 3/2008 | Zuckerman | |
| 2008/0278912 A1 | 11/2008 | Zavadsky et al. | |
| 2009/0159241 A1 | 6/2009 | Lipp et al. | |
| 2009/0161312 A1 | 6/2009 | Spearing et al. | |
| 2011/0013363 A1 | 1/2011 | Goldrian et al. | |
| 2011/0317367 A1 | 12/2011 | Campbell et al. | |
| 2012/0080984 A1 | 4/2012 | Watts | |
| 2013/0264026 A1 | 10/2013 | Eckberg et al. | |
| 2014/0071616 A1 | 3/2014 | Watanabe et al. | |
| 2014/0085808 A1 | 3/2014 | Tung et al. | |
| 2014/0124168 A1 | 5/2014 | Dean et al. | |
| 2014/0146465 A1 | 5/2014 | Wei | |
| 2014/0268548 A1 | 9/2014 | Rice et al. | |
| 2014/0286737 A1 | 9/2014 | Yang et al. | |
| 2014/0321050 A1* | 10/2014 | Sato | G06F 1/20 361/679.47 |
| 2015/0048950 A1 | 2/2015 | Zeighami et al. | |
| 2015/0109735 A1 | 4/2015 | Campbell et al. | |
| 2015/0382508 A1 | 12/2015 | Tatta et al. | |
| 2016/0088776 A1 | 3/2016 | Cornes et al. | |
| 2017/0023306 A1* | 1/2017 | Stavi | F28D 15/0275 |
| 2017/0245392 A1 | 8/2017 | Bilski, Jr. et al. | |
| 2017/0245396 A1 | 8/2017 | Bilski, Jr. et al. | |
| 2017/0257966 A1 | 9/2017 | Rozzi et al. | |

OTHER PUBLICATIONS

Office Action from the U.S. Patent and Trademark Office for U.S. Appl. No. 15/441,807 dated Feb. 9, 2018 (12 pages).

* cited by examiner

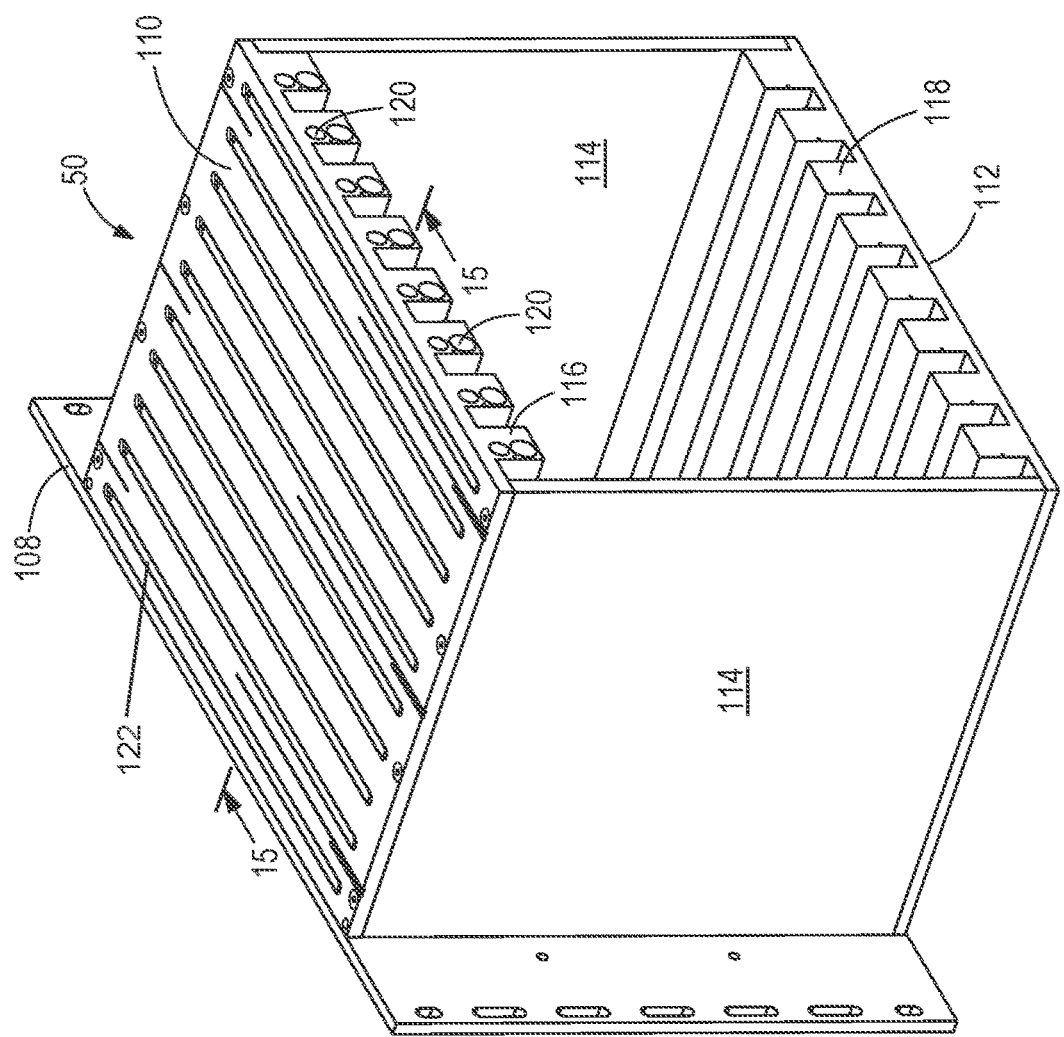
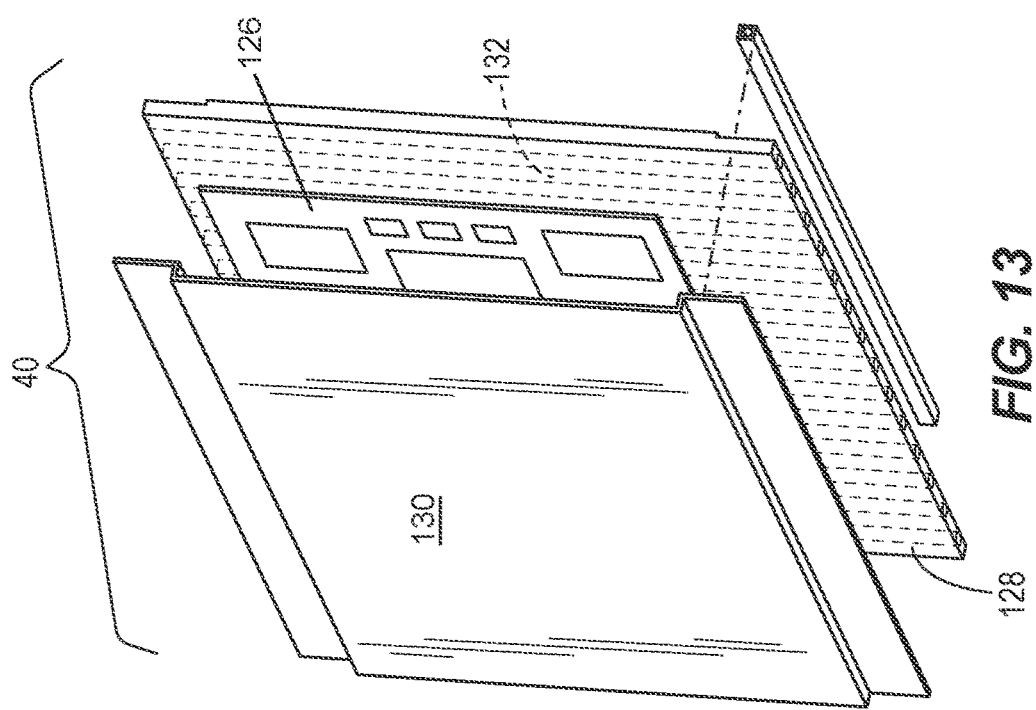
FIG. 14
FIG. 13

ELECTRONICS RACK WITH COMPLIANT HEAT PIPE

CROSS-REFERENCE TO RELATED APPLICATIONS

This patent application is a continuation of U.S. patent application Ser. No. 15/441,807, filed Feb. 26, 2017, and claims priority to U.S. patent application No. 62/299,336 filed on Feb. 24, 2016, the entire contents of each of which are incorporated herein by reference.

FEDERALLY SPONSORED RESEARCH

This invention was made with government support under purchase order number 7016038 awarded by Bechtel Marine Propulsion Corporation (BMPC)—Knolls Atomic Power Laboratory (KAPL). The government has certain rights in the invention.

BACKGROUND

In many electronic systems, the efficient cooling of electronic components and other heat sources has become a significant problem. With the advent of large-scale integrated circuit (IC) modules containing many thousands of circuit elements, it has become possible to pack large numbers of electronic components together within a very small volume. These integrated circuit modules generate significant amounts of heat during the course of their normal operation. Since most solid state devices are sensitive to excessive temperatures, a solution to the problem of the generation of heat by large scale IC's in close proximity to one another has become of increasing concern in the industry.

Current heat transfer systems have proven to be inadequate for removing the high levels of heat generated by heat sources at a low enough thermal resistance and at a sufficiently fast rate. Thus, there has developed a need to more efficiently remove heat from electronics systems.

SUMMARY

In one aspect, the present invention provides an electronics rack comprising a first cage adapted to support a first electronic component, a first heat sink positioned at a rear of the first cage and in thermal communication with the first cage (e.g., substantially vertically-oriented behind the first cage), a second cage adapted to support a second electronic component and positioned above the first cage, and a second heat sink separate from the first heat sink and in thermal communication with the second cage (e.g., substantially horizontally-oriented above the second cage). Each cage preferably facilitates insertion and removal of a plurality of electronic components from the front. In one embodiment, the first cage comprises a plurality of first cages arranged in a vertical stack, and the first heat sink is in thermal communication with the plurality of first cages. The second cage can comprise a cooling brick having a plurality of slots adapted to support upper edges of a plurality of vertically-oriented electronic boards, and the cooling brick can include a transverse heat pipe positioned above the plurality of slots.

In another aspect, the present invention provides an electronics rack comprising a frame defining a front and a rear, a cage adapted to support an electronic component, a heat sink positioned at a rear of the frame, and a compliant thermal collector operatively positioned between the cage and the heat sink. The thermal collector is strained between the cage and the heat sink when the cage is in a closed position to thereby provide thermal communication between the cage and the heat sink when the cage is in the closed position. In one embodiment, the compliant thermal collector comprises a heat pipe having a non-linear shape (e.g., including a curved portion). The non-linear shape facilitates flexing of the heat pipe to change the length of the thermal collector.

The thermal collector advantageously includes a plurality of heat pipes and a contact bar coupling the plurality of heat pipes, wherein the contact bar is pressed into contact with the heat sink. Preferably, the rack further includes an adjusting mechanism (e.g., including a threaded rod) for adjusting a position of the contact bar relative to the heat sink.

Other aspects of the invention will become apparent by consideration of the detailed description and accompanying drawings.

BRIEF DESCRIPTION OF THE DRAWINGS

FIG. 13 is an exploded perspective view of a power supply assembly.

FIG. 14 is a perspective view of the upper cage.

DETAILED DESCRIPTION

Before any embodiments of the invention are explained in detail, it is to be understood that the invention is not limited in its application to the details of construction and the arrangement of components set forth in the following description or illustrated in the accompanying drawings. The invention is capable of other embodiments and of being practiced or of being carried out in various ways. Also, it is to be understood that the phraseology and terminology used herein is for the purpose of description and should not be regarded as limiting. The use of "including," "comprising" or "having" and variations thereof herein is meant to encompass the items listed thereafter and equivalents thereof as well as additional items. The terms "mounted," "connected" and "coupled" are used broadly and encompass both direct and indirect mounting, connecting and coupling. Further, "connected" and "coupled" are not restricted to physical or mechanical connections or couplings, and can include electrical connections or couplings, whether direct or indirect.

Figure 1:
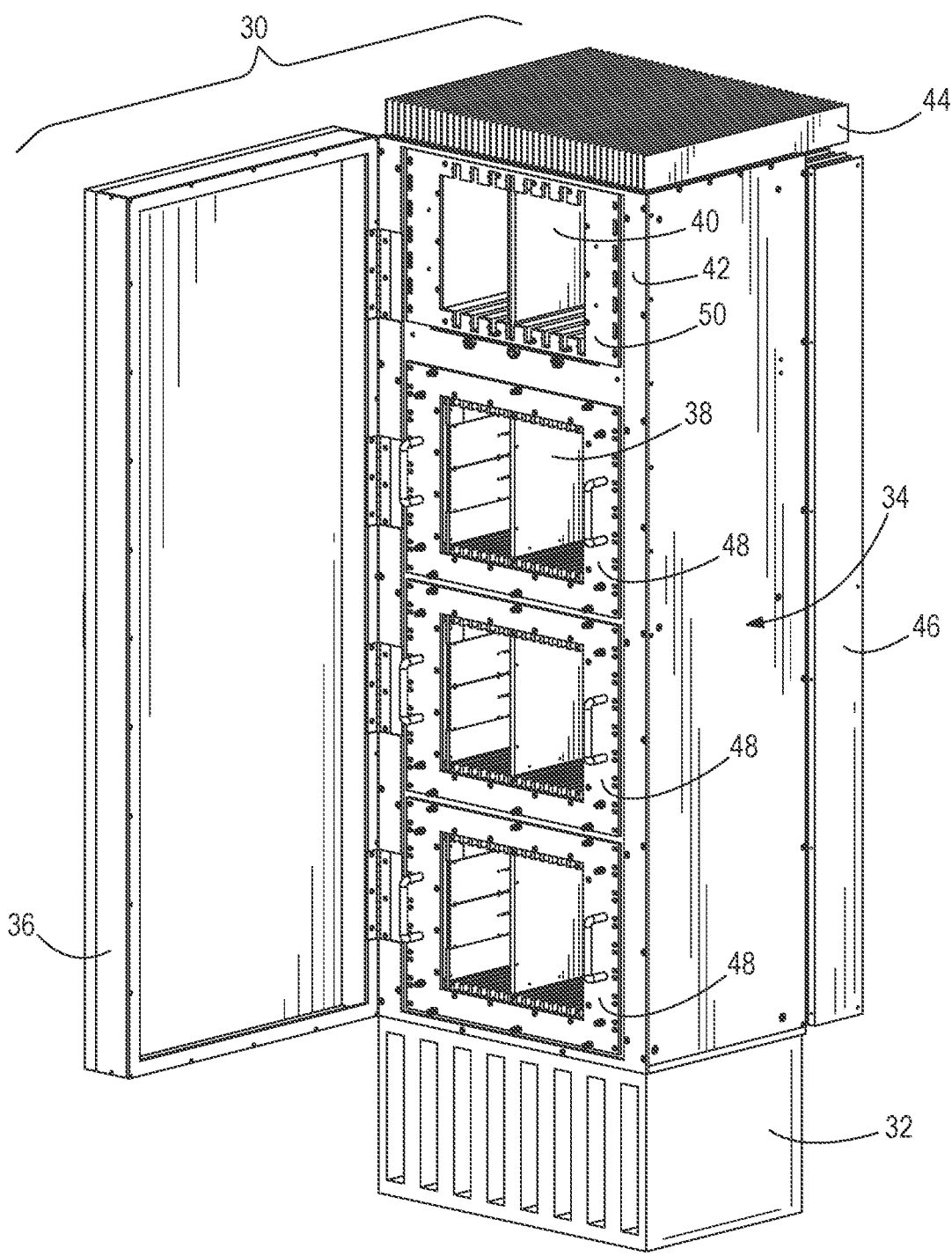
FIG. 1 is a perspective view of an electronics rack embodying the present invention.

FIG. 1 illustrates an electronics cabinet 30 positioned on a base 32. The cabinet 30 includes a rack 34 and a door 36 hinged to the rack 34. The cabinet 30 is designed to receive multiple printed circuit board (PCB) assemblies 38 and multiple power supply assemblies 40, as described below in more detail.

The rack 34 includes a frame 42, a substantially horizontally oriented upper heat sink 44 positioned above and supported by the frame 42, a substantially vertically oriented rear heat sink 46 positioned behind the frame 42, and a plurality of lower and upper cages 48,50 slidable into and out of the frame 42. In the illustrated embodiment, there are a total of four cages—three lower cages 48 and one upper cage 50. The three lower cages 48 in FIG. 1 are each adapted to support a plurality of the PCB assemblies 38 (only one PCB assembly is shown in each lower cage in FIG. 1), and the upper cage 50 in FIG. 1 is adapted to support a plurality of power supply assemblies 40, as described below in more detail.

Figure 2:
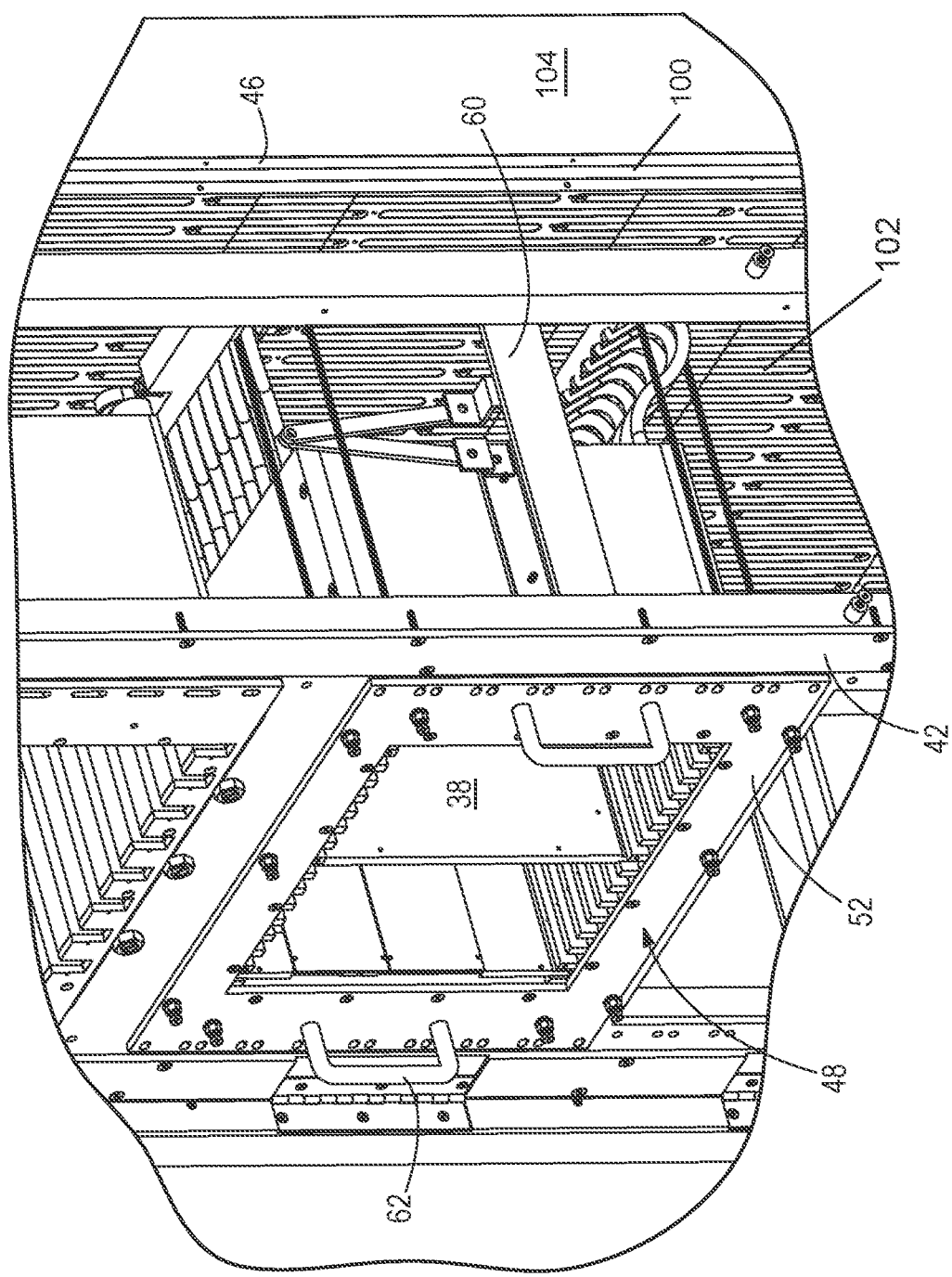
FIG. 2 is an enlarged perspective view of the electronics rack of FIG. 1 showing a lower cage with a portion of the rack removed for clarity.
Figure 3:
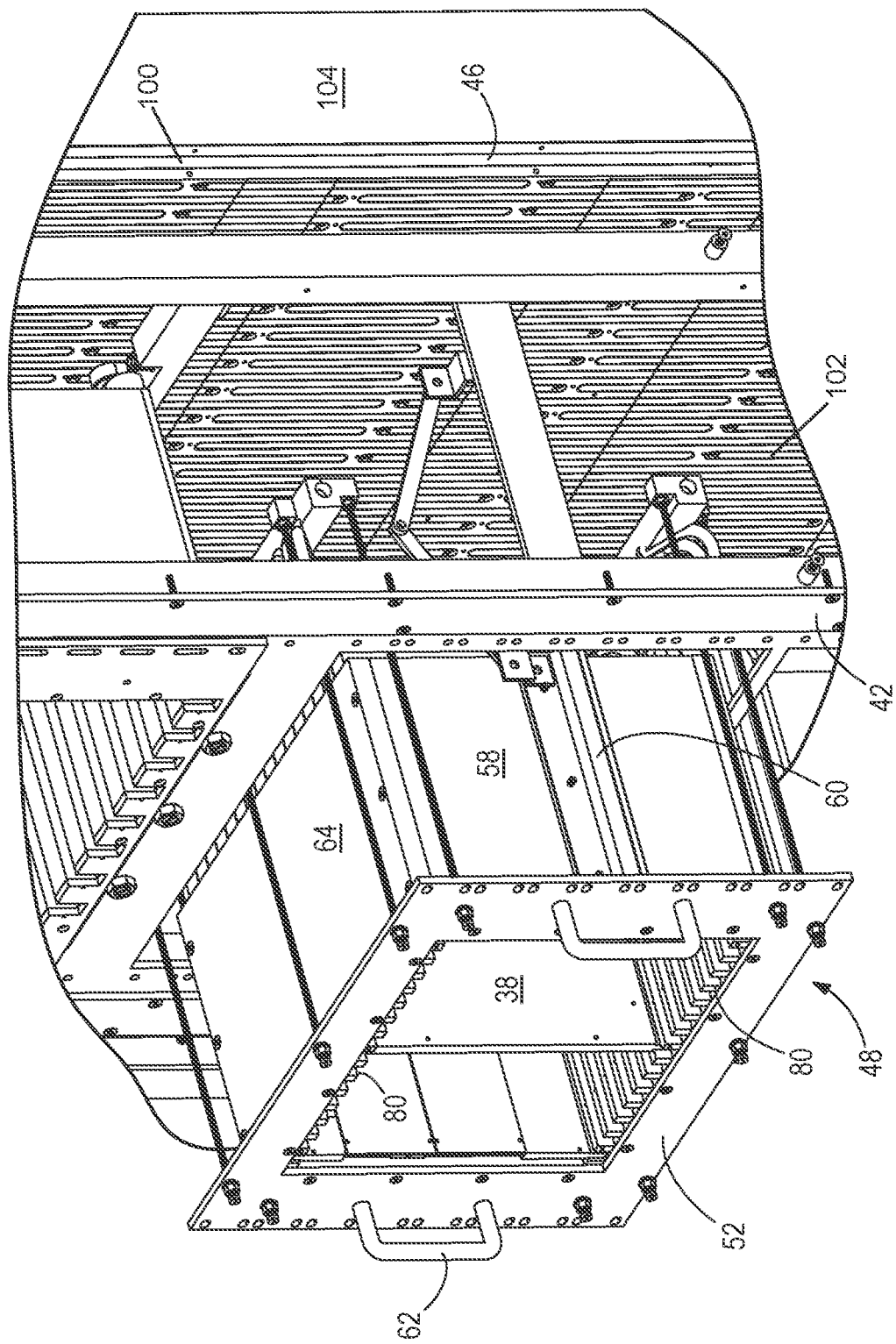
FIG. 3 is the view of FIG. 2 with the lower cage slid to an open position.

Referring to FIGS. 2-8, each of the lower cages 48 includes a front face 52, an upper thermal collector 54, a lower thermal collector 56, and left and right side walls 58 to form a generally box-like arrangement. This box-like arrangement is designed to slide into and out of the frame 42 on drawer slides 60 between a closed position (FIG. 2) and an open position (FIG. 3). Handles 62 on the front face 52 facilitate opening the lower cages 48.

Figure 7:
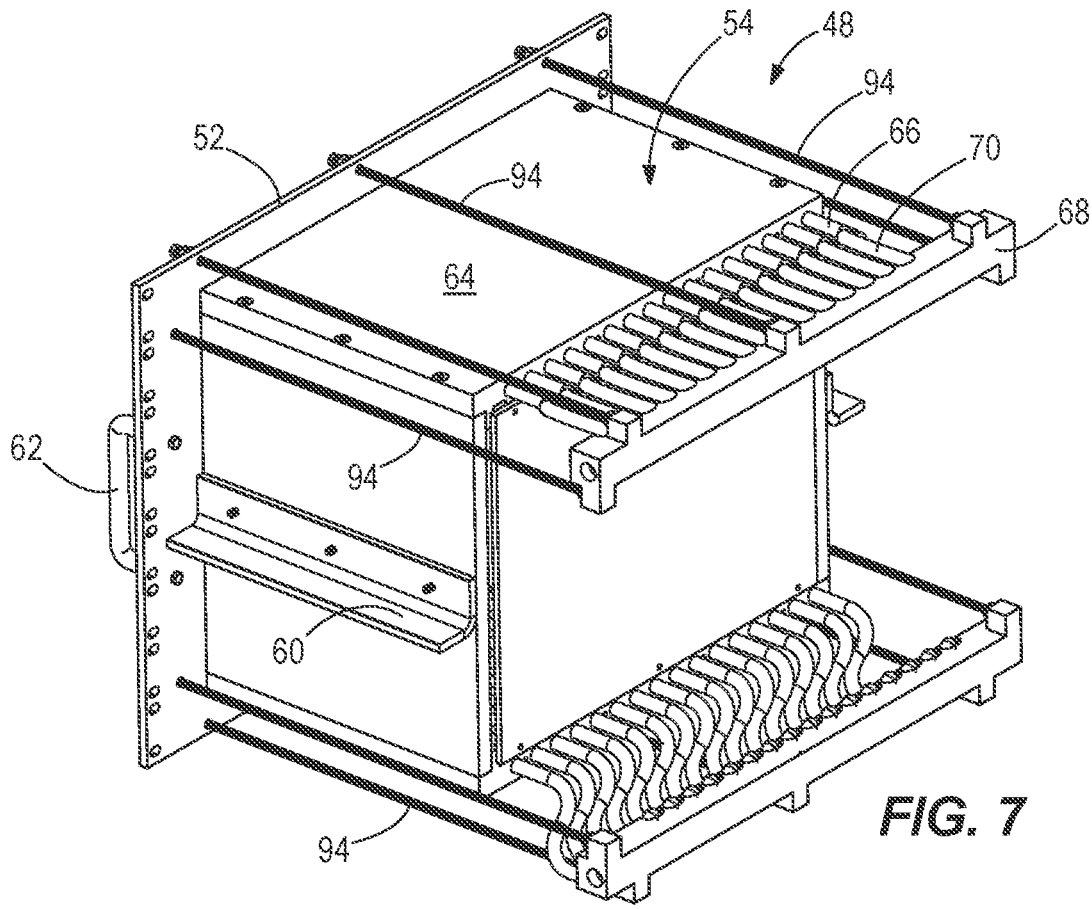
FIG. 7 is a rear perspective view of the lower cage from the electronics rack of FIGS. 1 and 2.
Figure 8:
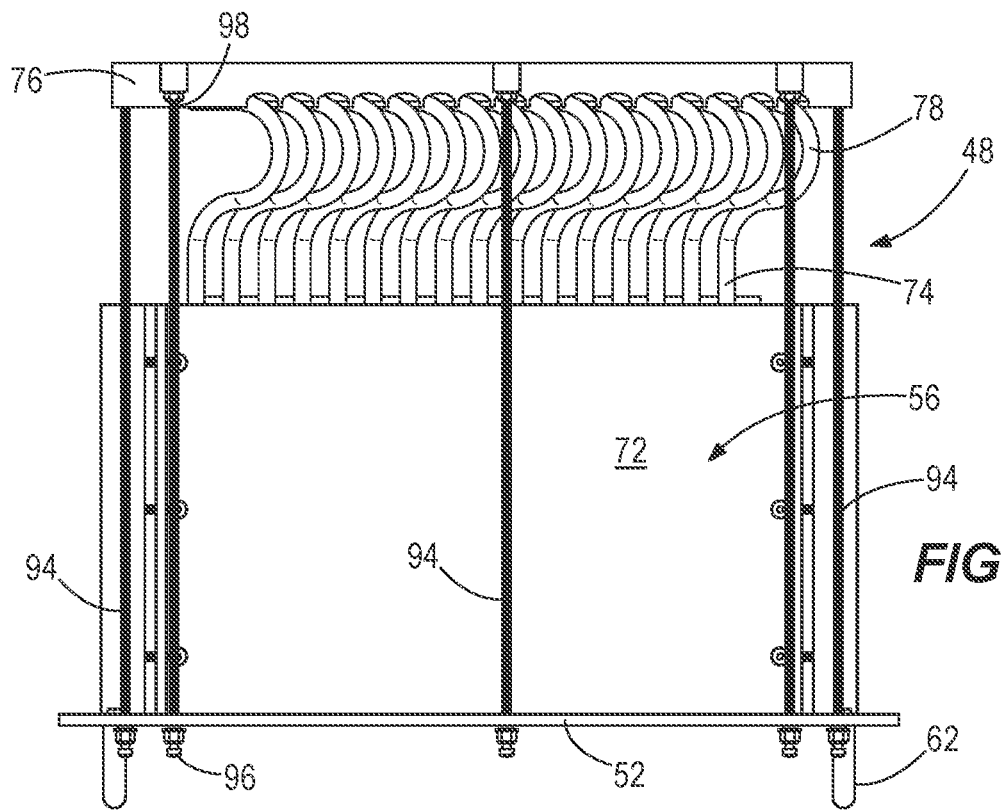
FIG. 8 is a bottom view of the lower cage of FIG. 7.

Referring to FIGS. 4-8, the upper thermal collector 54 includes an upper plate 64, upper heat pipes 66 partially embedded in the upper plate 64, and an upper contact bar 68 attached to distal ends of the upper heat pipes 66. As best shown in FIGS. 7-8, each of the upper heat pipes 66 is essentially identical to the others, and each includes a non-linear portion 70 between the upper plate 64 and the upper contact bar 68. In the illustrated embodiment, the non-linear portion 70 is curved to facilitate flexing of the upper heat pipe 66 in order to change the overall length of the upper thermal collector 54.

Similarly, the lower thermal collector 56 includes a lower plate 72, lower heat pipes 74 partially embedded in the lower plate 72, and a lower contact bar 76 attached to the distal ends of the lower heat pipes 74. As with the upper heat pipes 66, each of the lower heat pipes 74 is essentially identical to each other, and each includes a non-linear portion 78 that is curved to facilitate flexing of the lower heat pipes 74 in order to allow a change in length of the lower thermal collector 56.

As used herein, a "heat pipe" refers to a closed system of heat transfer in which a small amount of liquid within a sealed and evacuated enclosure is cycled through an evaporation and condensation cycle, as is known in the art. Heat entering the enclosure at one location on the casing or "pipe" evaporates liquid at that location, producing vapor which moves to a cooler location on the casing where it is condensed. The movement of the vapor is motivated by a small vapor pressure differential between the evaporator and the condenser locations. The heat transfer is accomplished when the heat of vaporization, which produces the vapor, is essentially moved with the vapor to the condenser location where it is given up as the heat of condensation. In order for the heat transfer to continue, the condensed liquid must be returned from the condenser to the evaporator where it will again be vaporized. Although this return can be accomplished by something as simple as gravity, capillary wicks have generally been used to permit heat pipes to be independent of the effects of gravity. Such a wick extends from a location near the condenser, where the liquid originates, to a location at the evaporator where it is needed for evaporation.

Figure 9:
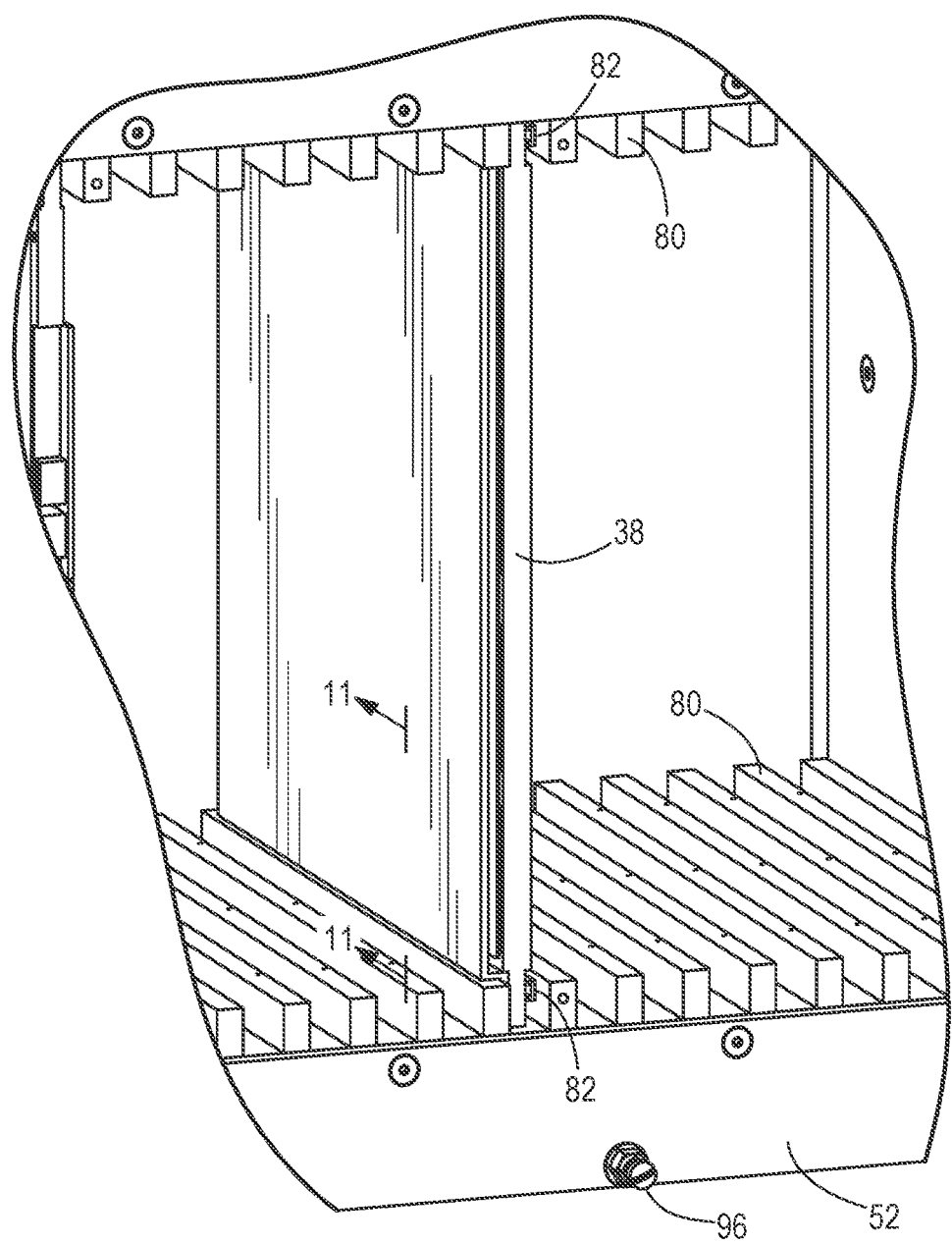
FIG. 9 is an enlarged front view of the cage of FIG. 2 showing a PCB assembly positioned in the cage.
Figure 11:
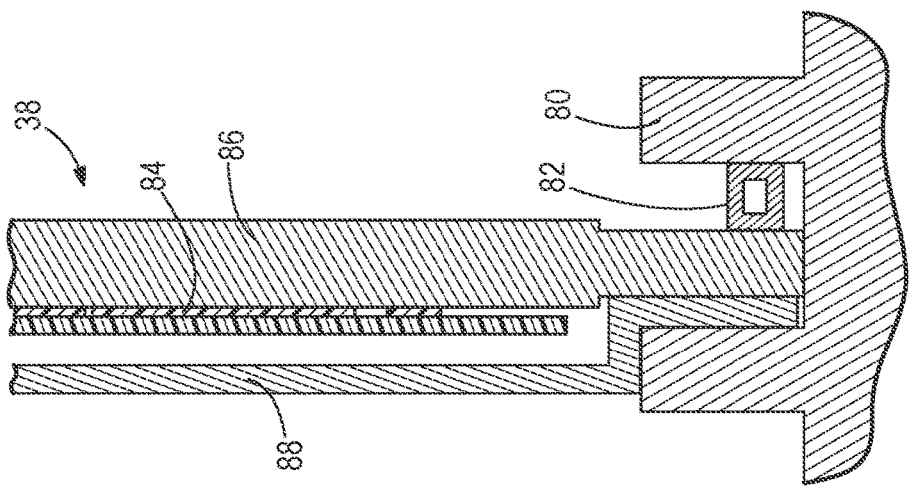
FIG. 11 is a section view of the assembled PCB assembly take at line 11-11 in FIG. 9.
Figure 10:
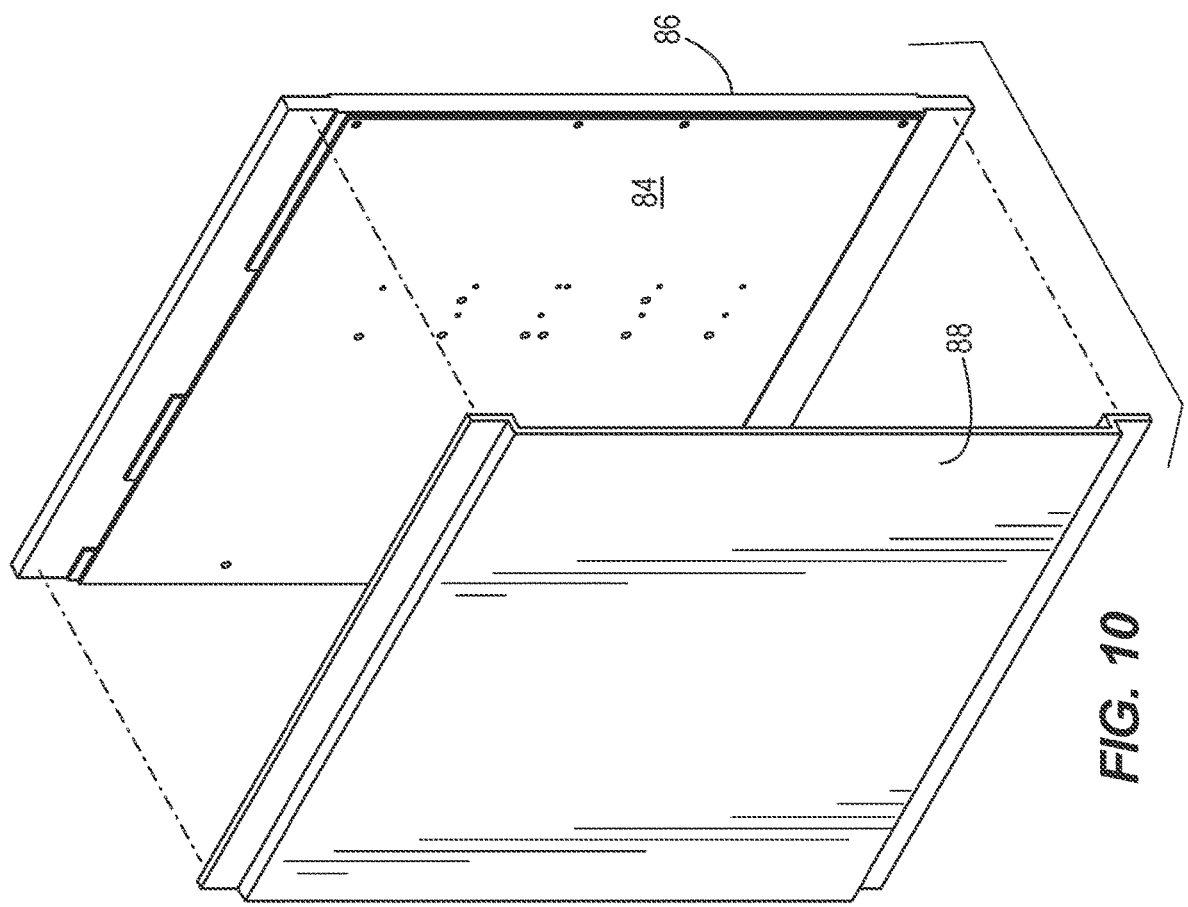
FIG. 10 is a partially exploded view of the PCB assembly from FIG. 9.

Referring to FIGS. 9-11, a series of cold rails 80 is positioned on a lower surface of the upper plate 64 and on an upper surface of the lower plate 72 to thereby define a series of elongated slots adapted to receive the plurality of PCB assemblies 38. A resilient wedge lock 82 (FIG. 11) is positioned in each slot to secure each of the PCB assemblies 38 in the corresponding slots, as described below in more detail.

Each of the PCB assemblies 38 includes a printed circuit board 84, a primary cold plate 86 and a secondary cold plate 88. As shown in FIGS. 9-11, the primary and secondary cold plates 86,88 sandwich the printed circuit board 84 to facilitate heat transfer from the printed circuit board 84 to the cold plates 86,88. Preferably, the cold plates 86,88 are made from aluminum to enhance the rate of heat transfer. As shown in FIG. 11, each of the PCB assemblies 38 is inserted into a corresponding slot in a lower cage 48 and is held in place by being sandwiched between the corresponding wedge lock 82 and the corresponding cold rail 80.

Figure 4:
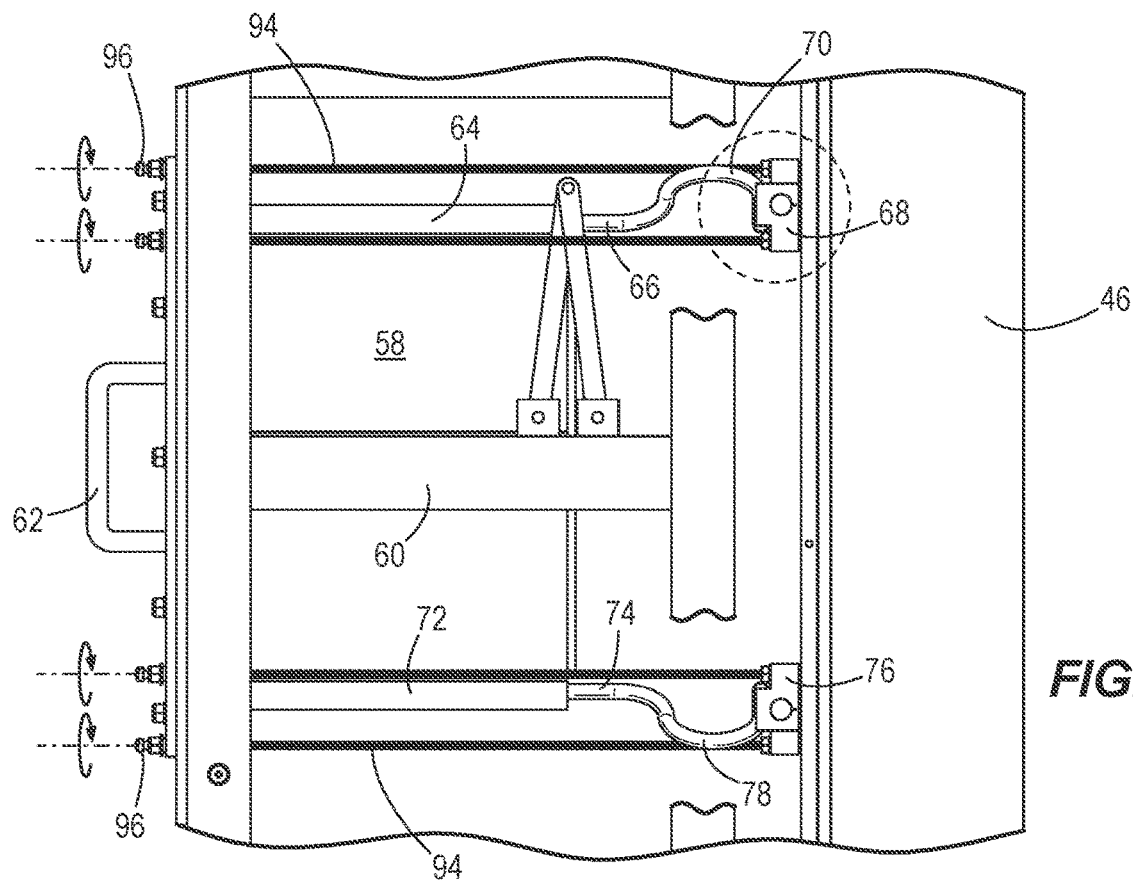
FIG. 4 is a partial side view of the electronics rack of FIG. 2.
Figures 5, 6:
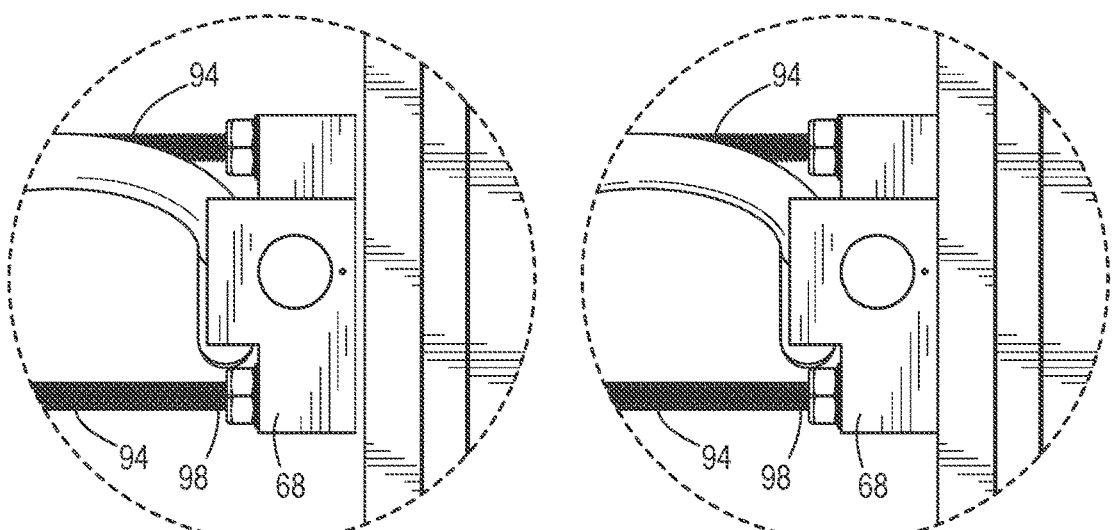
FIG. 5 is an enlarged view of the circled portion of FIG. 4 and showing an upper contact bar spaced from a rear heat sink.
FIG. 6 is the view of FIG. 5 with the upper contact bar moved into contact with the rear heat sink.

Each of the lower cages further includes an upper adjuster and a lower adjuster adapted to adjust the length of the upper and lower thermal collectors 54,56, respectively. Referring to FIGS. 7-8, each of the upper and lower adjusters includes five threaded rods 94 connected between the front face 52 and the corresponding contact bar 68,76. The proximate end 96 of each of the threaded rods 94 is keyed for rotation relative to the front face 52. In addition, each proximate end 96 extends slightly from the front face 52 and includes means to facilitate rotation of the threaded rod 94, as shown in FIG. 4. In the illustrated embodiment, the proximate end 96 of each threaded rod 94 is slotted to facilitate insertion of a flathead screwdriver and rotation of the threaded rod 94. The distal end 98 of each of the threaded rods 94 is threaded into a corresponding threaded hole in the corresponding contact bar 68,76. By rotating the threaded rods 94, the position of the corresponding contact bar 68,76 relative to the rear heat sink 46 (and relative to the front face 52) will be adjusted. In the illustrated embodiment, this adjustment can be up to five millimeters of displacement.

Referring to FIGS. 1-3, the rear heat sink 46 includes a rear plate 100 positioned at a rear of the rack 34 in a position where it can be contacted by the contact bars 68,76 upon closing of the lower cages 48 (with appropriate adjustment of the upper and lower adjusters 90,92). The rear heat sink 46 further includes rear heat pipes 102 embedded in the rear plate 100 in order to distribute heat received from the contact bars 68,76 throughout a greater volume of the rear plate 100. The rear heat sink 46 further includes rear fins 104 extending from a rear surface of the rear plate 100 to facilitate passive dissipation of heat to the surrounding air.

In operation, each of the lower cages 48 can be slid out of the rack 34 to facilitate insertion and removal of PCB assemblies 38. After all of the PCB assemblies 38 are properly installed in the corresponding slots, the lower cage 48 can be slid back into the rack 34. However, because of the variability and tolerances of the cabinet 30, it is possible that the upper and lower contact bars 68,76 do not properly engage the rear heat sink 46. Without solid engagement between the contact bars 68,76 and the rear heat sink 46, heat dissipation from the thermal collectors 54,56 to the rear heat sink 46 is substantially compromised. In order to facilitate solid contact between the contact bars 68,76 and the rear heat sink 46, the threaded rods 94 can be rotated to move the contact bars 68,76 from a spaced position (FIG. 5) to a contacting position (FIG. 6) relative to the rear heat sink 46.

Figure 12:
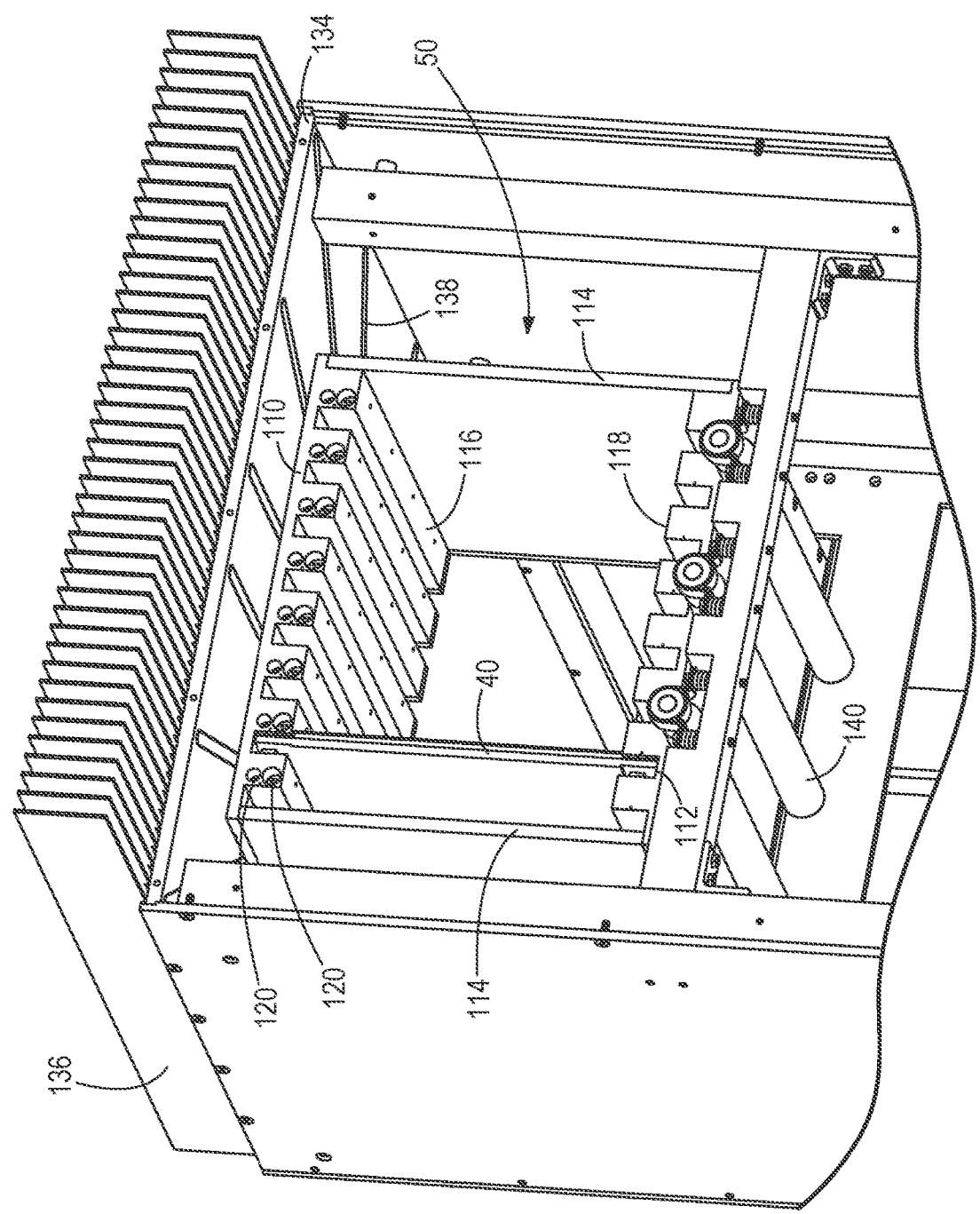
FIG. 12 is an enlarged front perspective view of an upper portion of the electronics rack of FIG. 1 showing an upper cage with portions of the electronics rack removed for clarity.
Figure 15:
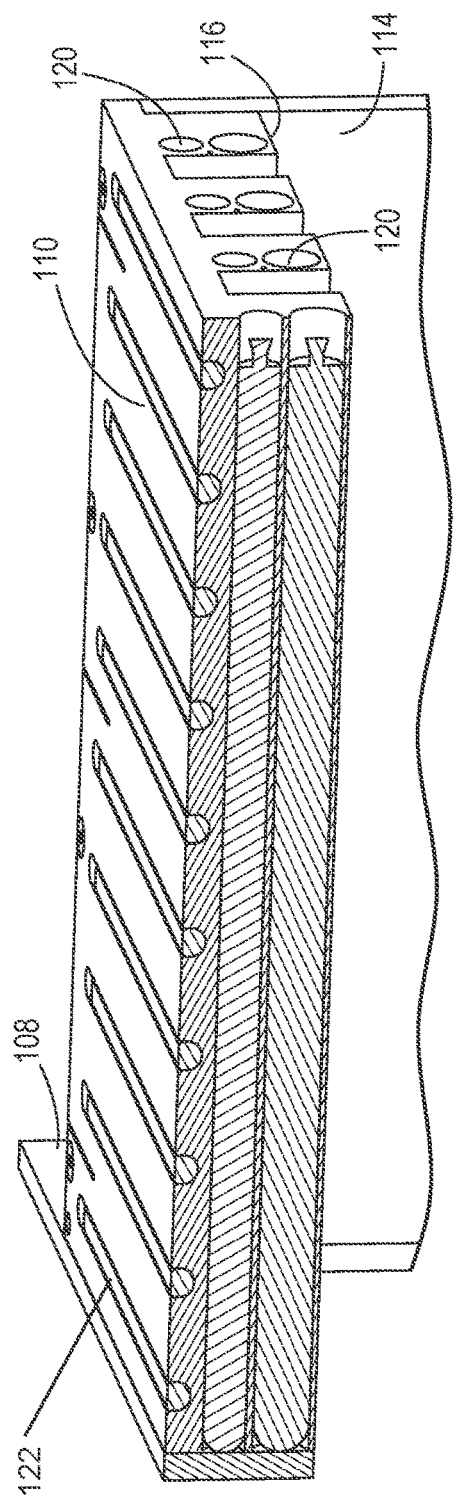
FIG. 15 is a section view of an upper plate from the upper cage taken along line 15-15 in FIG. 14.

Referring to FIG. 12, the upper cage 50 is designed to receive a plurality of power supply assemblies 40 (only one power supply assembly is shown in FIG. 12). The construction and arrangement of the upper cage 50 is slightly different from the lower cages 48 in that the upper cage 50 promotes heat transfer upward, while the lower cages 48 promote heat transfer rearward. The illustrated upper cage 50 includes a front face 108, a top plate 110, a bottom plate 112, and left and right side walls 114 connecting the top and bottom plates 110,112 to form a generally box-like arrangement. As with the lower cages 48, the upper cage 50 includes a series of top and bottom cold rails 116,118 (secured to the top and bottom plates 110,112, respectively) that define slots for receiving the power supply assemblies 40. However, in this arrangement, the top cold rails 116 are different from the bottom cold rails 118. Specifically, as shown in FIGS. 12, 14, and 15, the top cold rails 116 each include two embedded heat pipes 120 for distributing heat in each of the top cold rails 116. In addition, the top plate 110 is different from the bottom plate 112 in that the top plate 110 includes a plurality of embedded heat pipes 122 positioned transverse to the orientation of the top cold rails 116 (see FIGS. 14-15). These transverse heat pipes 122 transfer and distribute heat throughout the top plate 110. For convenience, the combined assembly of the top plate 110 and the top cold rails 116 is referred to as a "cooling brick," it being understood that a cooling brick would not necessarily need to have those components.

As with the lower cages 48, the upper cage 50 includes wedge locks 124 (FIGS. 18-19) positioned in the slots to facilitate securing the power supply assemblies 40 in the slots.

Figure 18:
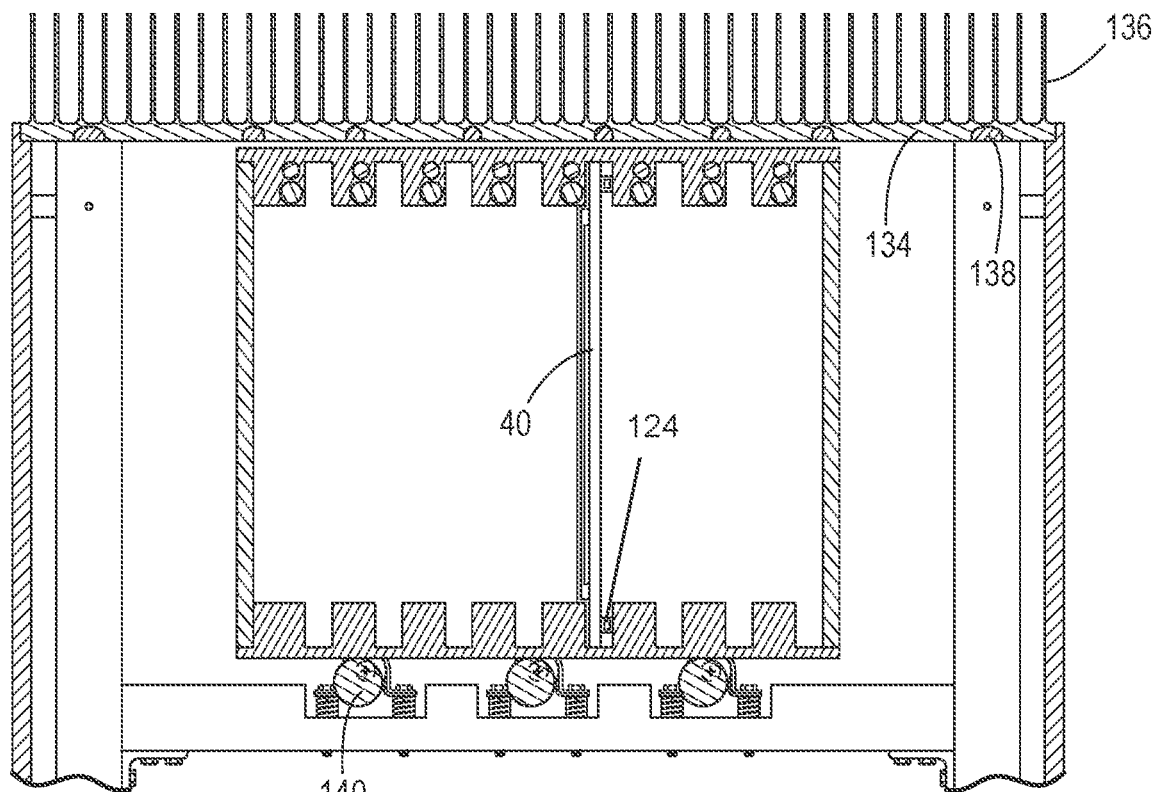
FIG. 18 is a section view of the power supply cage and eccentric cams in a lowered position and taken along line 18-18 in FIG. 17.
Figure 19:
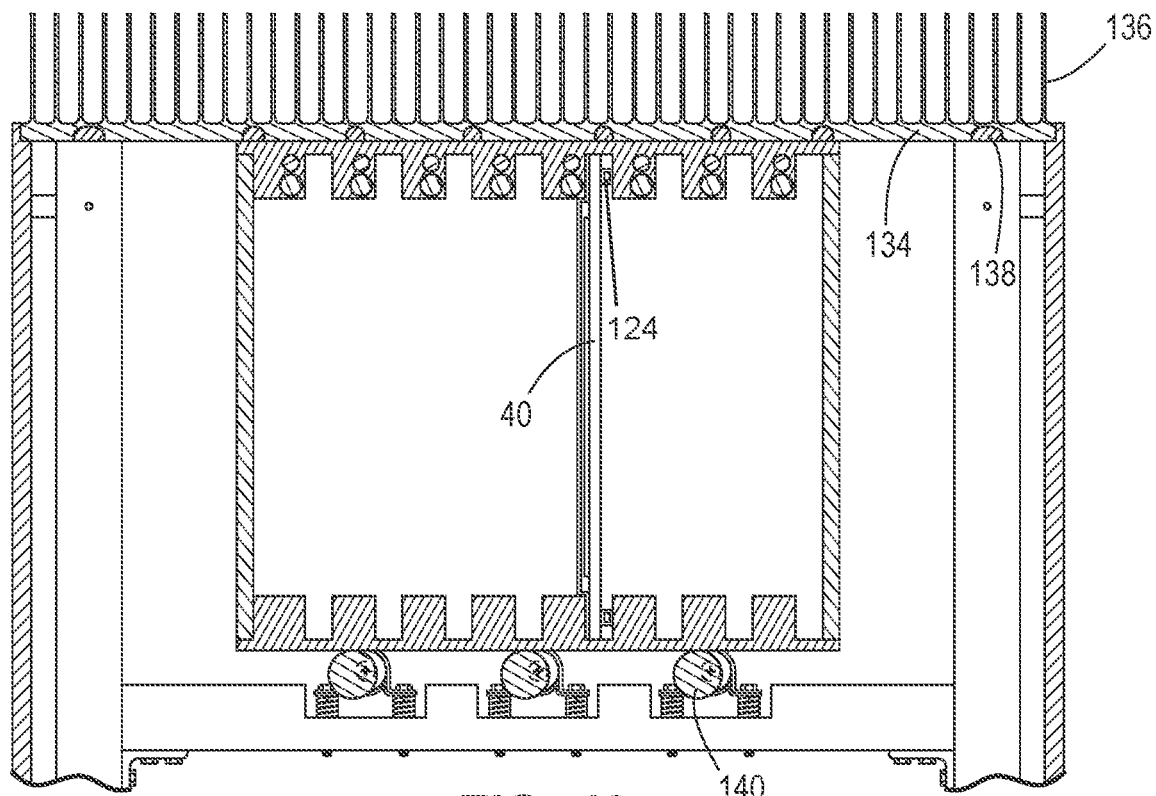
FIG. 19 is the section view of FIG. 18 with the eccentric cams in a raised position.

Similar to the PCB assemblies 38, the power supply assemblies 40 include a power supply board 126, a primary cold plate 128, and a secondary cold plate 130 (see FIG. 13). The power supply board 126 is sandwiched between the primary and secondary cold plates 128,130 to facilitate the transfer of heat from the power supply board 126. Each power supply assembly 40 is designed to be inserted into a pair of opposed top and bottom slots (formed by the top and bottom cold rails 116,118, respectively) and held in place by being sandwiched between the wedge locks 124 and the corresponding top and bottom cold rails 116,118, as shown in FIGS. 18-19.

Referring to FIG. 13, each of the cold plates 86,88,128, 130 can further include heat pipes 132 embedded in the cold plate. In the illustrated embodiment, these heat pipes 132 are only illustrated in connection with the primary cold plate 128 of the power supply assembly. These heat pipes 132 (shown in phantom in FIG. 13) can be positioned to promote the transfer of heat in the desired direction. For example, when used in the PCB assemblies 38 for the lower cages 48, the heat pipes 132 can be arranged to promote heat transfer upward and downward to the upper and lower thermal collectors 54,56, respectively. When used in connection with the power supply assembly 40, the heat pipes 132 can be embedded and positioned to promote transfer of heat upward to the top plate 110 and eventually to the upper heat sink 44.

Figure 16:
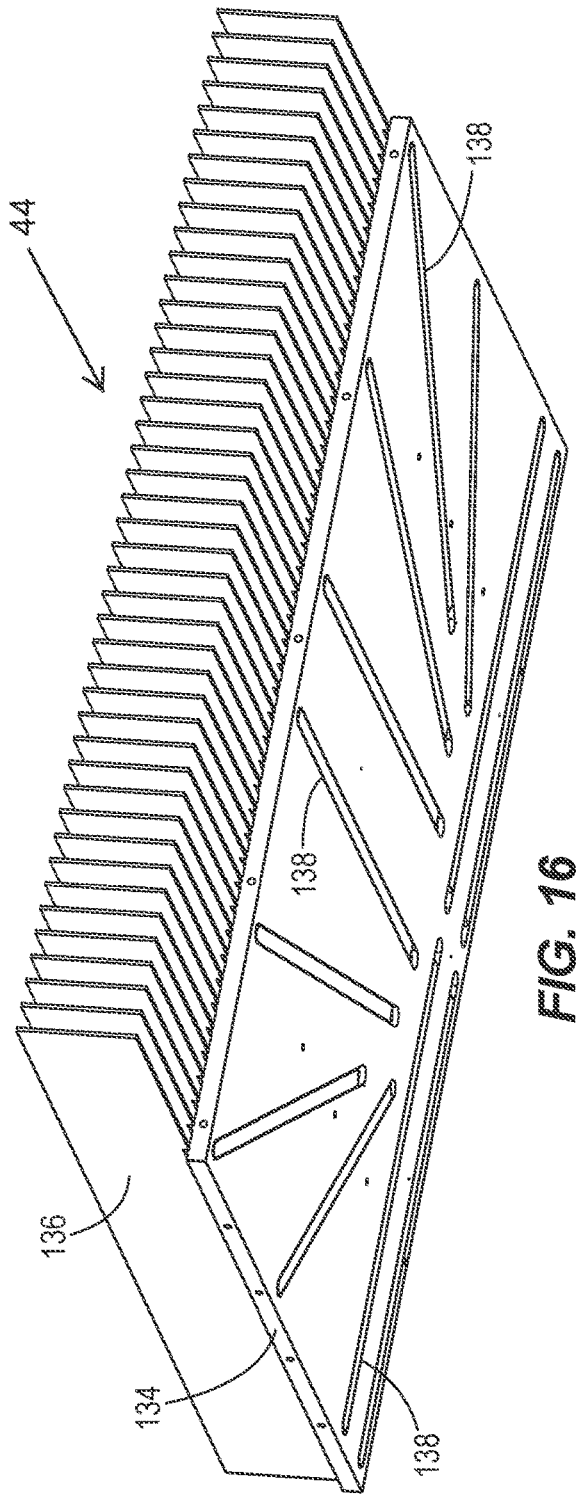
FIG. 16 is a bottom perspective view of an upper heat sink.

Referring to FIG. 16, the upper heat sink 44 includes a distribution plate 134 and a series of upper fins 136 extending upward from the distribution plate 134. The distribution plate 134 is positioned directly above the top plate 110 of the upper cage 50 and includes a series of heat pipes 138 that distribute heat in the distribution plate 134. The illustrated heat pipes 138 are in multiple orientations, such as parallel to the front face 108, perpendicular to the front face 108, and oblique to the front face 108. The illustrated upper fins 136 are arrange parallel to each other and perpendicular to the front face 108.

Figure 17:
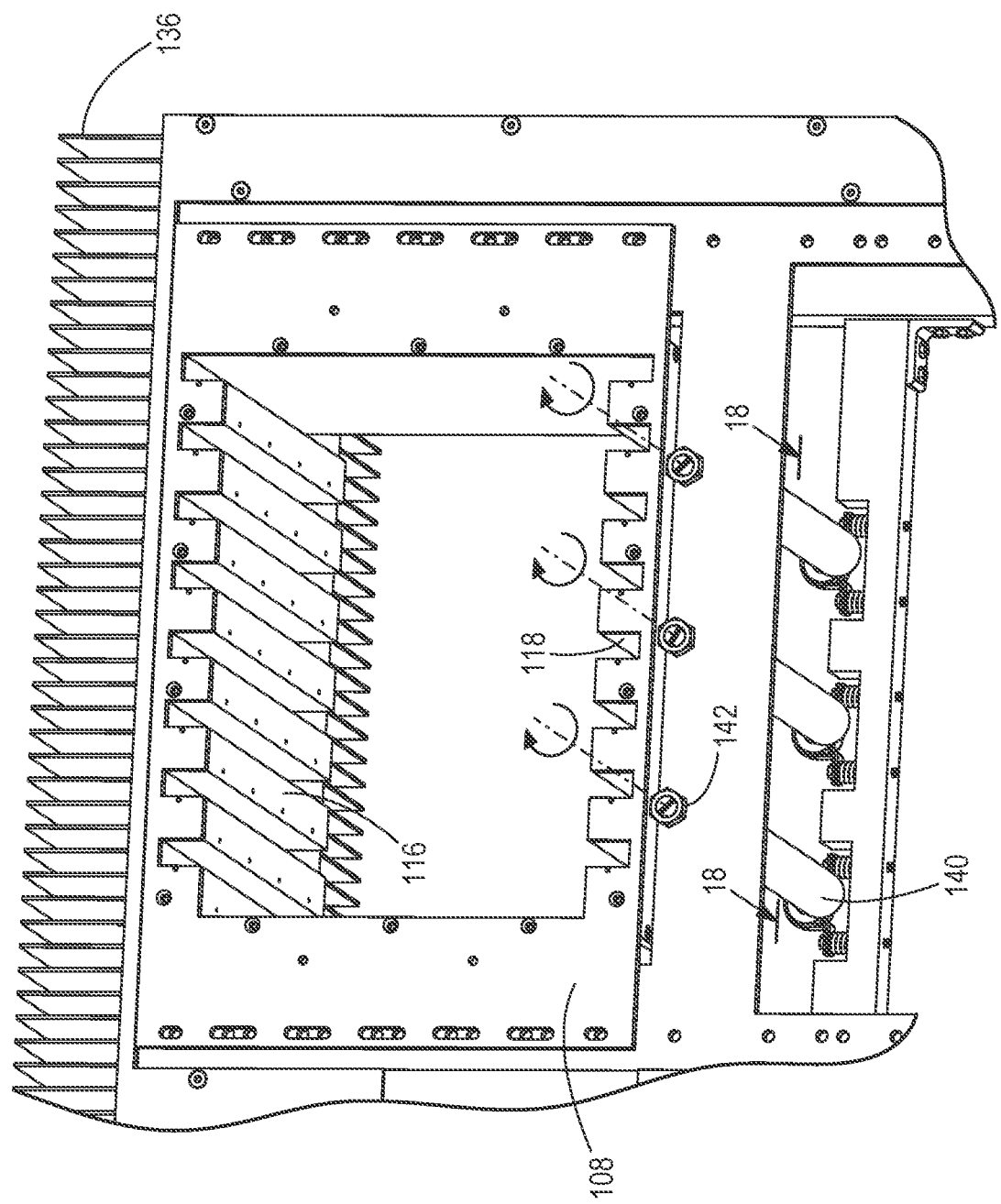
FIG. 17 is a perspective view of a front face of the upper cage and eccentric cams.

The upper cage 50 is designed to have a certain amount of vertical play relative to the frame 42 and relative to the upper heat sink 44. For example, in the illustrated embodiment, the upper cage 50 can be moved vertically about five millimeters relative to the frame 42. This vertical play allows the upper cage 50 to be moved vertically until the top plate 110 of the upper cage 50 contacts the distribution plate 134 of the upper heat sink 44. Referring to FIG. 17, this vertical movement can be accomplished using a series of eccentric cams 140 mounted to the frame 42 and positioned under and in contact with the upper cage 50. As best shown in FIGS. 18-19, rotation of the eccentric cams 140 will cause the upper cage 50 to move upwardly from a lowered position (FIG. 18) to a raised position (FIG. 19) to thereby facilitate the creation of contact between the top plate 110 and the distribution plate 134 of the upper heat sink 44. Each of the eccentric cams 140 includes a cam actuator 142 that extends from a front surface of the frame 42 to facilitate rotation of the eccentric cams 140. In the illustrated embodiment, the cam actuators 142 comprise hex heads that facilitate rotation of the eccentric cams 140 using a standard wrench.

Although the invention has been described in detail with reference to certain preferred embodiments, variations and modifications exist within the scope and spirit of one or more independent aspects of the invention as described.

What is claimed is:

1. An electronics rack comprising:
   a frame having a front, a rear, a top, and a bottom;
   a first cage adapted to removably support a first electronic component, the first cage having a front and a rear, the first cage being slidably disposed within the frame;
   a first heat sink positioned on the frame so that movement of the first cage with respect to the frame between the front and the rear of the frame changes a configuration of the first cage and first heat sink from a first state in which a rear portion of the first cage is not in direct thermal communication with the first heat sink to a second state in which the rear portion of the first cage is in direct thermal communication with the first heat sink;
   a second cage adapted to removably support a second electronic component and positioned above the first cage within the frame, the second cage being movably disposed within the frame; and
   a second heat sink positioned on the frame so that movement of the second cage with respect to the frame changes a configuration of the second cage and second heat sink from a first state in which a top of the second cage is not in direct thermal communication with the second heat sink to a second state in which the top of the second cage is in direct thermal communication with the second heat sink.

2. The electronics rack of claim 1, wherein the first cage is configured for insertion and removal of the first electronic component from the front of the first cage.

3. The electronics rack of claim 1, further comprising at least one additional cage slidably disposed within the frame, wherein the at least one additional cage is positioned to be placed into direct thermal communication with the first heat sink when the at least one additional cage is slid toward the rear of the frame.

4. The electronics rack of claim 1, where the second cage comprises a cooling brick having a plurality of slots adapted to support upper edges of a plurality of vertically-oriented electronic boards, and wherein the cooling brick includes a transverse heat pipe positioned above the plurality of slots.

5. The electronics rack of claim 1, wherein the second heat sink is positioned above the second cage.

6. The electronics rack of claim 1, wherein the first heat sink is substantially vertically-oriented and the second heat sink is substantially horizontally-oriented.

7. The electronics rack of claim 1, wherein the second heat sink is positioned adjacent the top of the frame.

8. The electronics rack of claim 1, wherein the first heat sink includes a rear plate configured to be directly contacted by the first cage when the first cage is slid toward the rear of the frame.

9. The electronics rack of claim 8, wherein the first heat sink further includes a heat pipe embedded within the rear plate.

10. The electronics rack of claim 9, wherein the first heat sink further includes a plurality of fins extending from a rear surface of the rear plate.

11. The electronics rack of claim 10, wherein the first cage includes a contact bar, wherein the contact bar is configured to directly contact the rear plate when the first cage is slid toward the rear of the frame, such that heat from the first electronic component passes from the contact bar, into the rear plate, and into both the heat pipe and the fins.

12. The electronics rack of claim 1, wherein the first heat sink includes a heat pipe.

13. The electronics rack of claim 12, wherein the first heat sink further includes fins extending rearwardly from the rear of the frame.

14. The electronics rack of claim 1, wherein the second heat sink includes a plate and a plurality of fins extending upwardly from the plate.

15. The electronics rack of claim 14, wherein the second cage includes a top plate, and wherein the plate of the second heat sink is positioned directly above the top plate of the second cage.

16. The electronics rack of claim 15, wherein the second heat sink further includes a heat pipe configured to distribute heat within the plate of the second heat sink.

17. The electronics rack of claim 15, wherein the second heat sink further includes a plurality of heat pipes configured to distribute heat within the plate of the second heat sink, wherein one of the heat pipes is oriented in a first direction, and a second one of the heat pipes is oriented in a second, different direction.

18. The electronics rack of claim 1, wherein the second heat sink includes a plurality of heat pipes, wherein one of the heat pipes is oriented in a first direction, and a second one of the heat pipes is oriented in a second, different direction.

19. The electronics rack of claim 1, wherein the first cage has a box-like structure and includes a front face, a left side wall, a right side wall, and a handle configured to facilitate sliding movement of the first cage toward and away from the rear of the frame.

20. The electronics rack of claim 1, wherein the second heat sink is positioned adjacent the top of the frame, wherein the first heat sink includes a plurality of fins extending rearwardly away from the rear of the frame, wherein the second heat sink includes a plurality of fins extending upwardly away from the top of the frame, and wherein both the first heat sink and the second heat sink each further include a plurality of heat pipes.

21. The electronics rack of claim 1, wherein movement of the second cage relative to the frame is an upward movement toward the top of the frame, wherein the second cage is positioned to be taken out of direct thermal communication with the second heat sink when the second cage is moved toward the bottom of the frame and out of direct physical contact with the second heat sink.

22. An electronics rack comprising:
a frame having a top, a bottom, a front, and a rear, wherein the frame includes an interior cavity, wherein the frame includes a plurality of openings along the front of the frame configured to receive sliding cages;
a first heat sink coupled to and positioned at the rear of the frame, wherein the first heat sink defines a first closed thermal system;
a first cage configured to removably support a first electronic component, the first cage being slidably disposed within the frame between the front and the rear of the frame such that sliding movement of the first cage with respect to the frame between a first position and a second position selectively moves the first electronic component into and out of thermal communication with the first heat sink;
a second heat sink coupled to and positioned at the top of the frame, wherein the second heat sink defines a second closed thermal system independent from the first closed thermal system of the first heat sink; and
a second cage configured to removably support a second electronic component, the second cage being movably disposed within the frame such that movement of the second cage with respect to the frame between a first position and a second position selectively moves the second electronic component into and out of thermal communication with the second heat sink.

23. The electronics rack of claim 22, wherein the first heat sink further includes a rear plate and a first plurality of fins that extend from the rear plate, wherein a first plurality of heat pipes are embedded in the rear plate, wherein the second heat sink includes a distribution plate and a second plurality of fins that extend from the distribution plate, and wherein a second plurality of second heat pipes are configured to distribute heat in the distribution plate.

24. An electronics rack comprising:
a frame having a top, a bottom, a front, and a rear, wherein the frame includes an interior cavity, wherein the frame includes a plurality of openings along the front of the frame configured to receive sliding cages;
a first heat sink coupled to and positioned at the rear of the frame, wherein the first heat sink includes a first plurality of fins extending rearwardly from the rear of the frame;
a first cage configured to support a first electronic component, the first cage being slidably disposed within the frame such that movement of the first cage in a first direction with respect to the frame moves the first cage into and out of thermal communication with the first heat sink;

a second heat sink coupled to and positioned at the top of the frame, the second heat sink being separate from the first heat sink, wherein the second heat sink includes a second plurality of fins extending upwardly from the top of the frame and a plurality of heat pipes, wherein one of the heat pipes extends in a first direction, and another of the heat pipes extends in a second, different direction; and a second cage configured to support a second electronic component, the second cage being movably disposed within the frame such that movement of the second cage in a second direction different from the first direction with respect to the frame changes a configuration of the second cage and second heat sink from a first state in which the second cage is not in thermal communication with the second heat sink to a second state in which the second cage is in thermal communication with the second heat sink.

25. The electronics rack of claim 24, wherein the second heat sink further includes a distribution plate and a plurality of heat pipes are configured to distribute heat in the distribution plate.

26. The electronics rack of claim 24, wherein the first heat sink is coupled to the rear of the frame and the second heat sink is coupled to the top of the frame.

27. The electronics rack of claim 24, wherein the second heat sink comprises a plurality of heat pipes and one of the heat pipes extends in a first direction and another of the heat pipes extends in a second, different direction.

28. The electronics rack of claim 24, further comprising an eccentric cam coupled to the frame and positioned under and in contact with the second cage.

* * * * *